(12) United States Patent
Mori

(10) Patent No.: US 7,443,000 B2
(45) Date of Patent: Oct. 28, 2008

(54) SEMICONDUCTOR DEVICE HAVING SIDEWALL PORTION WITH SILICON NITRIDE FILM FORMED ABOVE LAYER AND SEPARATED FROM REGION ABOVE PRIMARY INSULATING FILM VIA OXIDE FILM, WHERE THE PORTION IS FORMED ON SIDEWALL OF GATE ELECTRODE

(75) Inventor: Hirotaka Mori, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 105 days.

(21) Appl. No.: 11/276,185

(22) Filed: Feb. 17, 2006

(65) Prior Publication Data

US 2006/0186486 A1    Aug. 24, 2006

(30) Foreign Application Priority Data

Feb. 18, 2005    (JP)    ............................. 2005-043200

(51) Int. Cl.
*H01L 29/94*    (2006.01)
(52) U.S. Cl. ...................................... 257/411; 257/324
(58) Field of Classification Search .................. 257/411, 257/324
See application file for complete search history.

(56) References Cited

U.S. PATENT DOCUMENTS

| | | | |
|---|---|---|---|
| 6,436,767 B1 * | 8/2002 | Koishikawa | 438/265 |
| 6,787,827 B2 * | 9/2004 | Inumiya et al. | 257/288 |
| 2004/0228499 A1 * | 11/2004 | Shibata et al. | 381/312 |
| 2005/0199940 A1 * | 9/2005 | Mine et al. | 257/315 |

FOREIGN PATENT DOCUMENTS

JP    2003/78045 A    3/2003

* cited by examiner

*Primary Examiner*—Richard T. Elms
*Assistant Examiner*—Allison P Bernstein
(74) *Attorney, Agent, or Firm*—Rabin & Berdo, P.C.

(57) ABSTRACT

A semiconductor device includes (i) a semiconductor layer, (ii) a first insulating film formed in the semiconductor layer, (iii) a conductive film continuously formed on the semiconductor layer and the first insulation film in a line shape, (iv) a second insulating film formed between the conductive film and the semiconductor layer along the conductive film, (v) a sidewall portion which is formed on a sidewall of the conductive film along the conductive film and which includes an oxide film and a first nitride film that is formed above the semiconductor layer and separated from a region above the first insulating film through the oxide film, (vi) and impurity diffusion regions formed on a surface of the semiconductor layer on both sides of the sidewall portion.

6 Claims, 8 Drawing Sheets

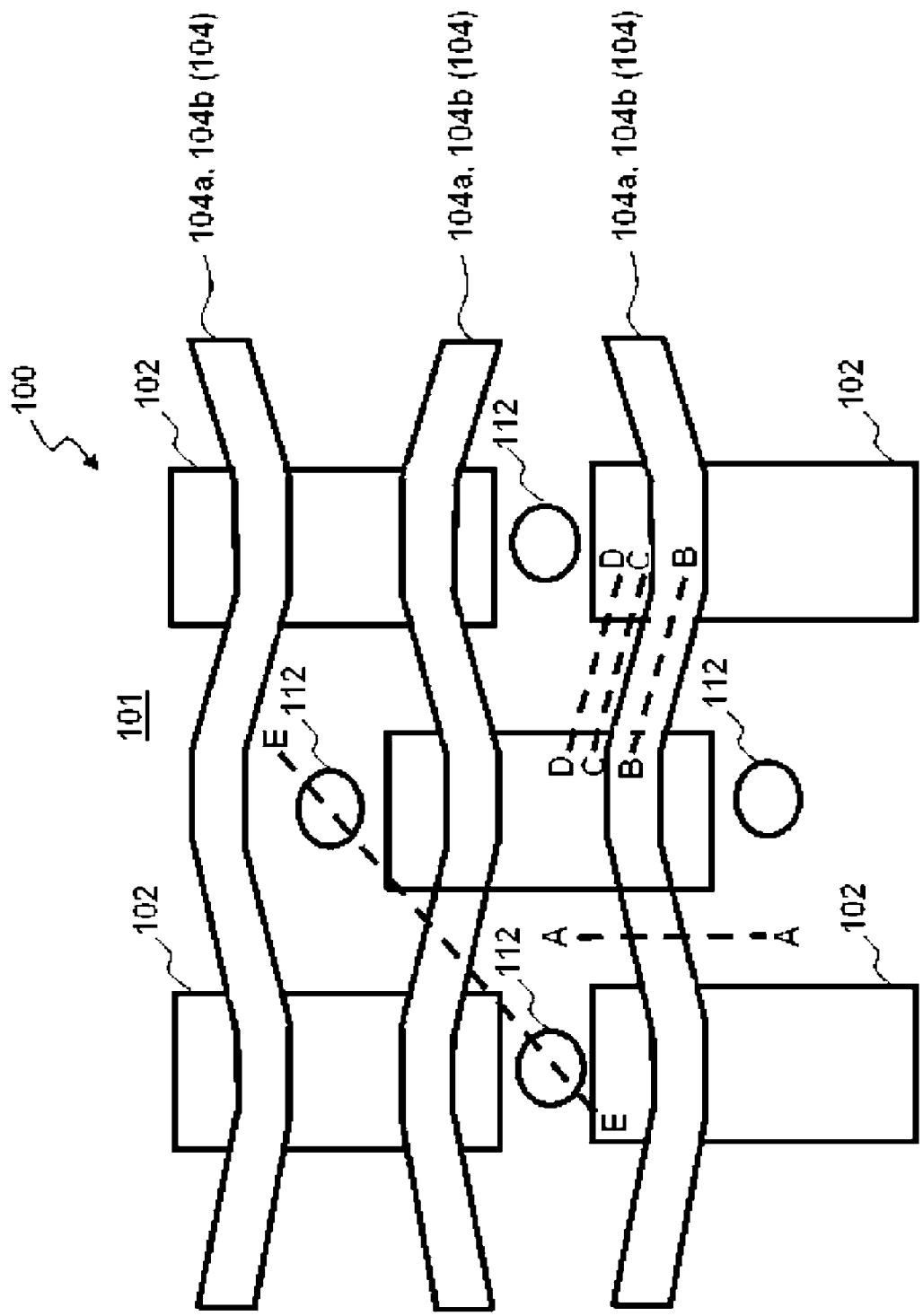

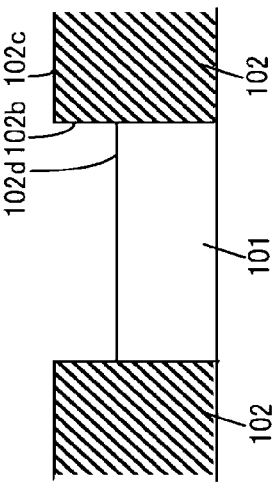
Fig. 2A
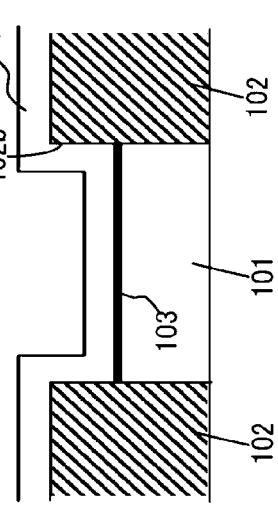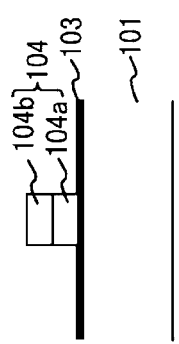
Fig. 2B
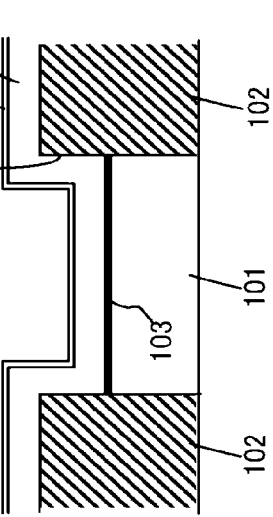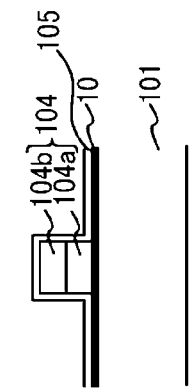
Fig. 2C

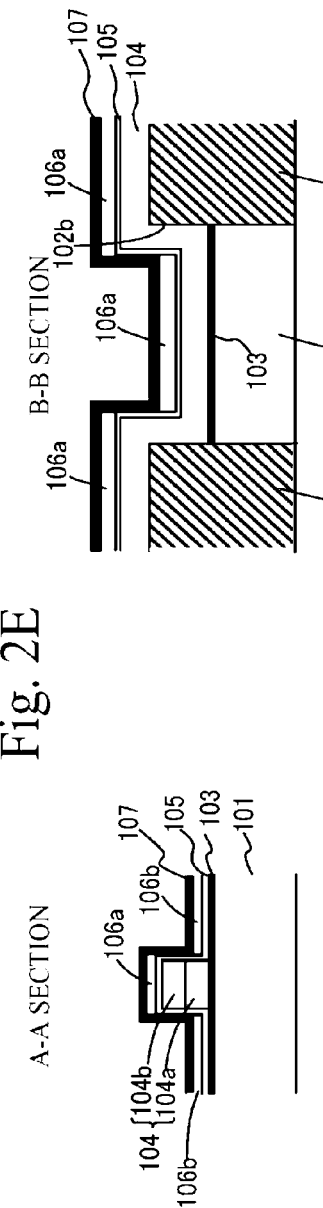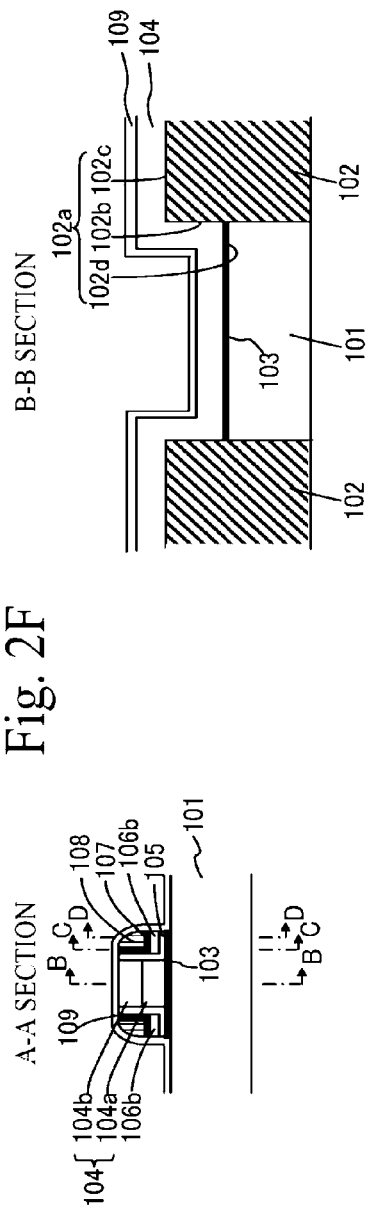

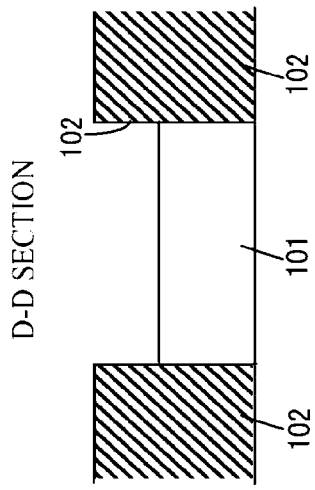
Fig. 3A
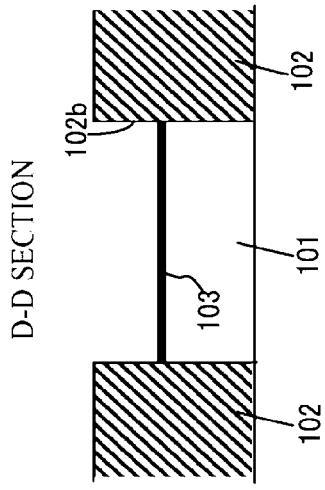
Fig. 3B
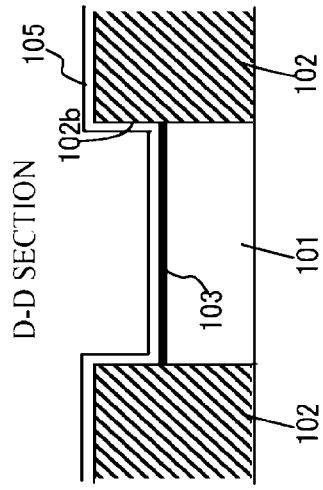
Fig. 3C
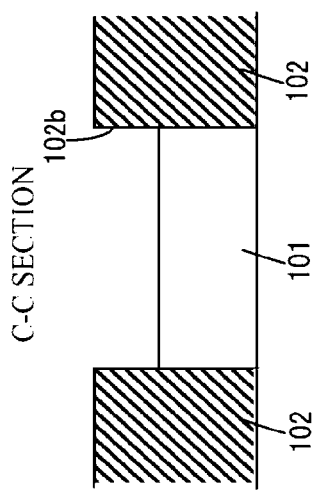
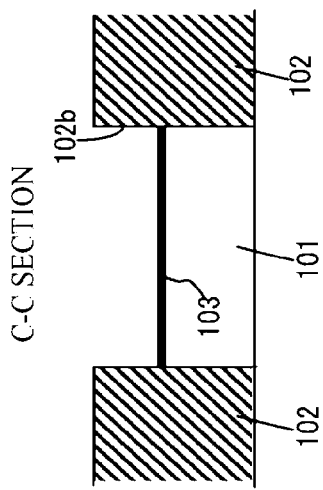
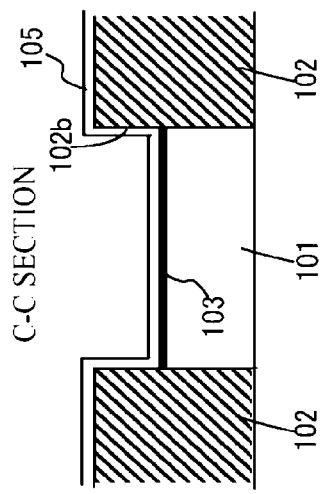

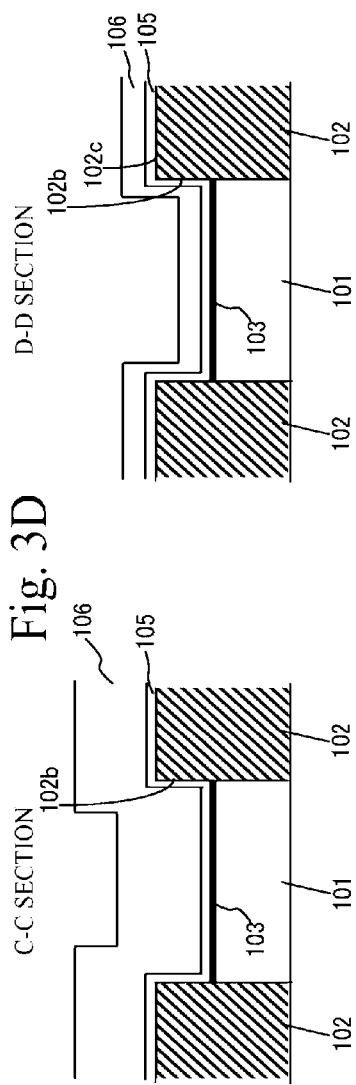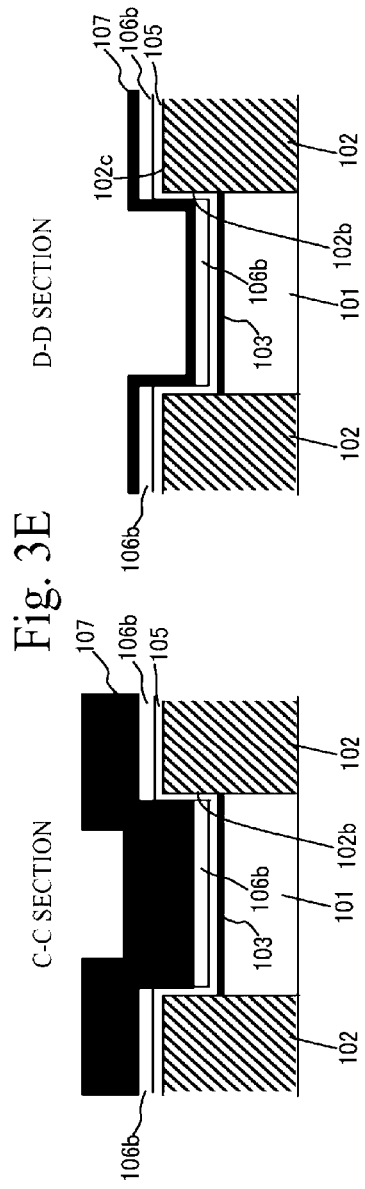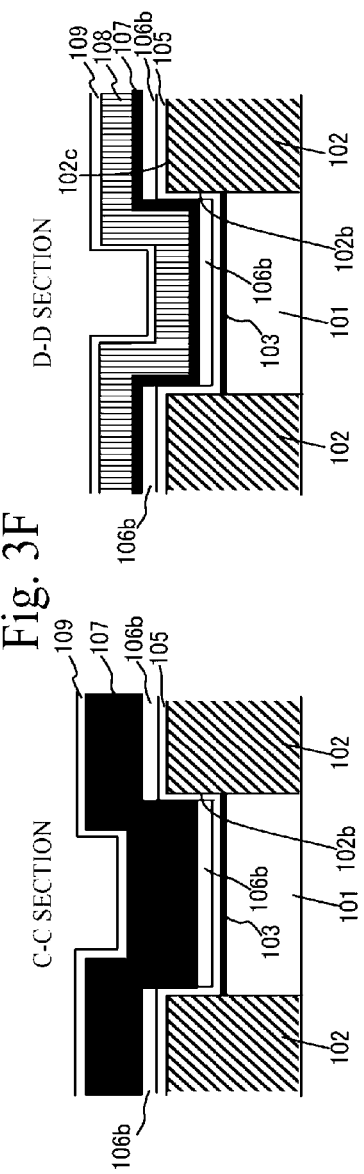

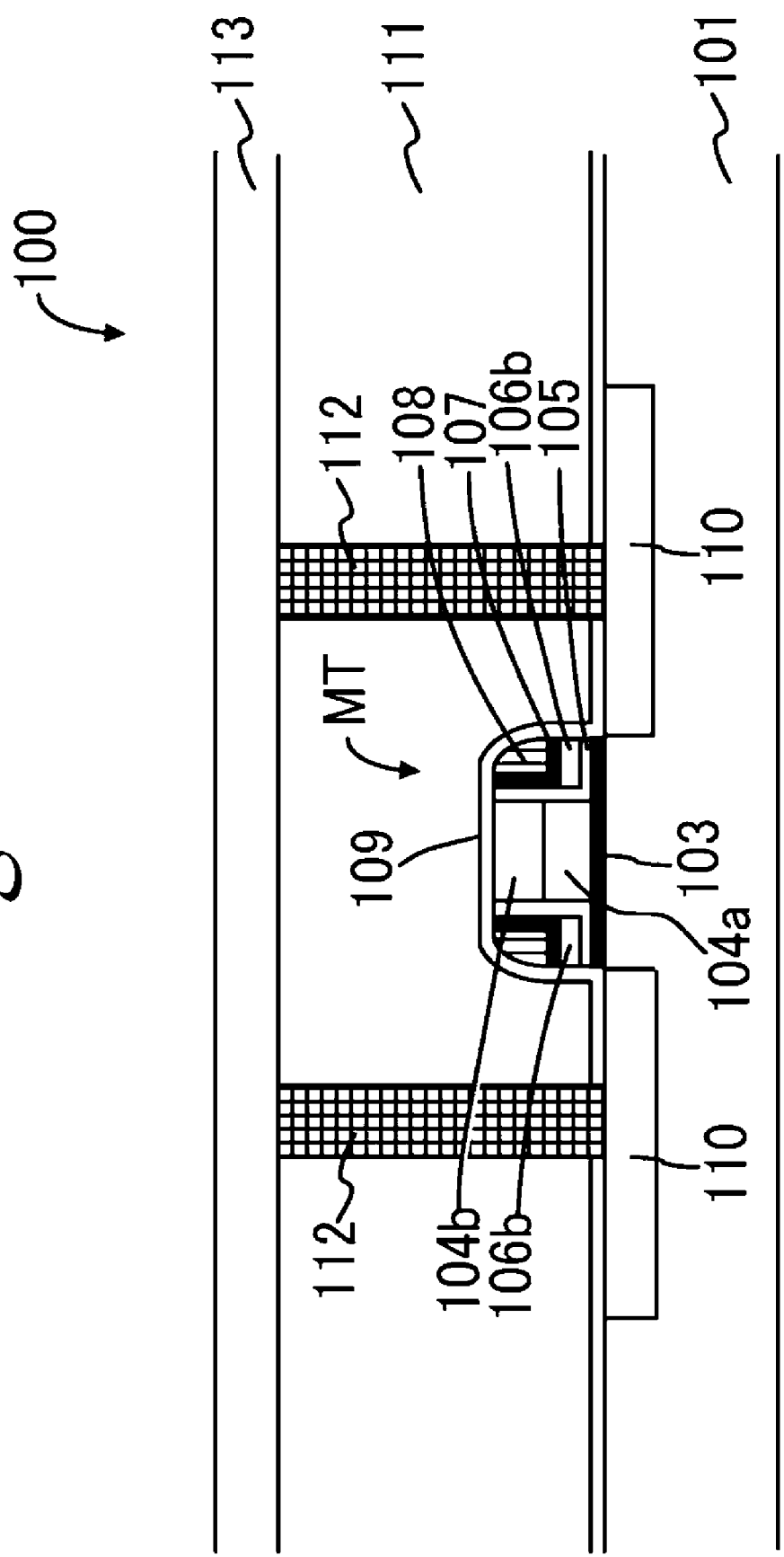

SEMICONDUCTOR DEVICE HAVING SIDEWALL PORTION WITH SILICON NITRIDE FILM FORMED ABOVE LAYER AND SEPARATED FROM REGION ABOVE PRIMARY INSULATING FILM VIA OXIDE FILM, WHERE THE PORTION IS FORMED ON SIDEWALL OF GATE ELECTRODE

BACKGROUND OF THE INVENTION

1. Field of the Invention

The present invention relates to a semiconductor device, especially a semiconductor device that accumulates electrical charges in an insulating film.

A nonvolatile semiconductor memory has been heretofore known, which includes a charge storage film formed by laminating dielectric films to be used for so-called a metal-oxide-nitride-oxide-semiconductor (MONOS) memory, and stores information by controlling the amount of electric charges accumulating in the charge storage film. The nonvolatile semiconductor memory accumulates electrical charges in charge traps discretely existing in a dielectric substance film, and this memory has robustness which makes it difficult for the electrical charges that discretely accumulate in the dielectric substance film to leak out. In other words, when the electrical charges discretely accumulate in the dielectric substance film and the electrical charges with continuous energy accumulate in a conductor, it will be more difficult for the electrical charges discretely accumulating in the dielectric substance film to leak out. For example, electrical charges accumulate in an oxide-nitride-oxide (ONO) film formed by laminating an oxide film, a nitride film, and an oxide film in a MONOS memory. Therefore, electrical charges accumulating in a nitride film will rarely leak out of the ONO film even if a thin oxide film formed between a semiconductor substrate and a nitride film has some type of defect therein.

A heretofore known nonvolatile semiconductor memory has a structure in which a gate electrode formed on a semiconductor layer as a word line is provided astride a plurality of memory cells, and a charge storage film is formed along this word line. In this type of a nonvolatile semiconductor memory, each memory cell stores 2-bit information by accumulating electrical charges in charge storage films formed on both sides of the gate electrode, respectively. In this memory structure, the gate electrode is formed on the semiconductor layer so that it lies astride a plurality of memory cells. For example, the charge storage film is an ONO film formed by sequentially accumulating an oxide film, a nitride film, and an oxide film. The oxide film and the nitride film, which comprise the lower layer of the ONO film, are formed as the sidewall portion of the gate electrode, and their cross-sections are formed to be L-shape. Also, the oxide film comprising the upper layer of the ONO film is formed to fill a portion created by the L-shape of the oxide film and the nitride film that comprise the upper layer of the ONO film.

In this type of nonvolatile semiconductor memory, electrons are injected into the charge traps existing in a silicon nitride film by controlling the voltage of a gate electrode and the voltage between the source and the drain, and thus information is stored. Electrical charges accumulate in the charge traps existing in the silicon nitride film, and those existing in the boundary surface of the silicon nitride film with a silicon dioxide film.

2. Background Information

Japanese Patent Application Publication JP-A-2003-78045 discloses another type of nonvolatile semiconductor memory that stores 2-bit information in each memory cell. In this type of the nonvolatile semiconductor memory, a first dielectric film and a gate electrode (i.e., a first memory gate electrode) are formed on a semiconductor substrate in substantially the same shape, and the surface of the gate electrode and that of a semiconductor substrate are covered with a second dielectric film. The first dielectric film and the second dielectric film are charge storage films, and each of them is an ONO film formed by sequentially laminating a silicon dioxide film, a silicon nitride film, and a silicon dioxide film. Also, a conductive sidewall portion (i.e., a second memory gate electrode) is formed on a sidewall portion of the gate electrode through the second dielectric film. This conductive sidewall portion is connected to a word line. Also, one of the source-drain regions is formed on a portion of a semiconductor substrate, which is located on either of the outer sides of the conductive sidewall portion. A first bit line is connected to this source-drain region. Also, the other source-drain region is formed on a portion of the semiconductor substrate, which corresponds to a region located from a portion immediately below the other sidewall portion to the outside of the sidewall portion. A second bit line is connected to this source-drain region.

In this type of nonvolatile semiconductor memory, 2-bit data is stored in each memory cell by a memory transistor MTa in which a channel formed below the gate electrode (i.e., the first memory gate electrode) is controlled, and a memory transistor MTb in which a channel formed below the conductive sidewall portion (i.e., the second memory gate electrode) is controlled. Electrical charges are injected into the first dielectric film and the second dielectric film, respectively, by controlling the voltage between the first bit line and the second bit line, the voltage of the memory gate electrode, and the voltage of the second memory gate electrode. Thus data storage is conducted.

In the above described memory structure in which charge storage films are formed on the sidewall portions formed on both sides of the gate electrode functioning as a word line, a nitride film has a lengthwise portion continuously formed along the sidewall of the gate electrode in the lengthwise direction, as well as a crosswise portion formed in the crosswise direction on the lower portion of the sidewall portion of the gate electrode that effectively works for charge retention. In other words, the lengthwise portion that does not function as a memory is formed in connection with the crosswise portion that functions as a memory by changing the threshold voltage Vt of a memory transistor in accordance with the storage of information. Also, the nitride film is continuously formed in a field region as well as an active region that functions as a memory element. In a MONOS memory structure, electrical charges accumulate in the discrete charge traps existing in the nitride film. Therefore, electrical charges easily move even at a relatively low temperature through the charge transfer between the charge traps existing in the nitride film, although the amount of energy required for the movement of electrical charges in a nitride film is larger than that required for the movement of electrical charges in a conductor. Therefore, as described above, if the crosswise portion of the nitride film that functions as a memory is connected to the lengthwise portion of the nitride film that does not function as a memory and the field region that does not function as a memory element, electrical charges move to the portions other than the lower side portion (i.e., the crosswise portion) of the gate electrode. As a result, a problem is caused in which the cell current occurring at the time of information readout from a memory cell changes over time.

However, the changes in cell current over time caused by the movement of electrical charges in the nitride film is not described in Japan Patent Application Publication JP-A-2003-78045.

SUMMARY OF THE INVENTION

It is therefore an object of the present invention to resolve the above-described problem, and to provide a semiconductor device in which electrical charges accumulate in an insulating film and which inhibits changes in the accumulated charge over time.

In accordance with a first aspect of the present invention, a semiconductor device is comprised of (i) a semiconductor layer, (ii) a first insulating film formed in the semiconductor layer, (iii) a conductive film continuously formed on the semiconductor layer and the first insulation film in a line shape, (iv) a second insulating film formed between the conductive film and the semiconductor layer along the conductive film, (v) a sidewall portion which is formed on a sidewall of the conductive film along the conductive film and which includes an oxide film and a first nitride film that is formed above the semiconductor layer and separated from a region above the first insulating film through the oxide film, and (vi) impurity diffusion regions formed on a surface of the semiconductor layer on both sides of the sidewall portion.

According to the semiconductor device of the present invention, electrical charges accumulate in the first nitride film separated from the region on the first insulating film, and thus information is stored. Therefore, it is possible to prevent electrical charges, which accumulate in the first nitride film to store information, from moving to the region on the first insulating film. Because of this, it is possible to inhibit changes in the electrical charges over time, which accumulate in the first nitride film to store information.

In accordance with a second aspect of the present invention, a charge storage film structure of a semiconductor device, which is formed over a semiconductor substrate comprised of a semiconductor layer and a first insulating film formed on the semiconductor layer, is comprised of (i) a nitride film formed above the semiconductor layer along a conductive film continuously formed on the semiconductor layer and the first insulating film in a line shape, and (ii) an oxide film that sandwiches the nitride film and separates the nitride film from a region above the first insulating film.

In accordance with a third aspect of the present invention, a charge storage film structure of a semiconductor device, which is formed over a semiconductor substrate comprised of a semiconductor layer and a first insulating film formed on the semiconductor layer, is comprised of (i) a nitride film formed only on a region above the semiconductor layer along a conductive film continuously formed on the semiconductor layer and the first insulating film in a line shape, and (ii) an oxide film that sandwiches the nitride film.

In accordance with a fourth aspect of the present invention, a charge storage film structure of a semiconductor device, which is formed over a semiconductor substrate comprised of a semiconductor layer and a first insulating film formed on the semiconductor layer, is comprised of (i) a nitride film that is formed along a conductive film continuously formed on the semiconductor layer and the first insulating film in a line shape and separated into a region formed above the semiconductor layer and a region formed above the first insulating film, and (ii) an oxide film that sandwiches the nitride film.

Also, it is another object of the present invention to resolve the above-described problem, and to provide a method for manufacturing a semiconductor device in which electrical charges accumulate in an insulating film and which inhibits changes in the accumulated charge over time.

In accordance with a fifth aspect of the present invention, a method for manufacturing a semiconductor device comprises the steps of (i) preparing a semiconductor substrate having a semiconductor layer, (ii) forming a first insulating film in the semiconductor layer more thickly than the semiconductor layer, (iii) forming a conductive film on the semiconductor layer and the first insulating film in a line shape, (iv) forming a first oxide film to cover the semiconductor layer, the first insulating film, and the conductive film, (v) forming a nitride film on the first oxide film so that thickness of a portion of the nitride film, which is formed along a sidewall portion of a step portion formed by the difference between the semiconductor layer and the first insulating film, is thinner than the thickness of a portion of the nitride film formed on the semiconductor layer and the thickness of a portion of the nitride film formed on the first insulating film, and (vi) forming a second oxide film by oxidizing the thickness of the nitride film corresponding to the thickness of the portion of the nitride film formed along the sidewall portion of the step portion, and simultaneously separating the nitride film into a first nitride film formed on a region above the semiconductor layer and a second nitride film formed on a region above the first insulating film.

In accordance with a sixth aspect of the present invention, the following aspects are incorporated in the method according to the fifth aspect of the present invention: (i) the step of forming the nitride film is conducted so that the thickness of a portion of the nitride film formed along a sidewall portion of the conductive film is formed more thinly than the thickness of a portion of the nitride film formed on a region above the semiconductor layer and the thickness of a portion of the nitride film formed on a region above the first insulating film, and (ii) the step of oxidizing the nitride film is conducted so that the thickness of the portion of the nitride film formed along the sidewall portion of the conductive film is completely oxidized.

In accordance with a seventh aspect of the present invention, the following aspect is incorporated in the method according to the fifth aspect of the present invention: the step of forming the nitride film is conducted with a LPCVD method.

In accordance with an eighth aspect of the present invention, the following aspect is incorporated in the method according to the seventh aspect of the present invention: the LPCVD method is conducted by controlling the flow direction of a reaction gas so that the reaction gas flows vertically from above the semiconductor substrate towards an upper surface of the semiconductor substrate and a controlling the chamber pressure to be less than 0.25 Torr.

In accordance with a ninth aspect of the present invention, the following aspect is incorporated in the method according to the fifth aspect of the present invention: the step of oxidizing the nitride film is conducted with radical oxidization.

In accordance with a tenth aspect of the present invention, the following aspect is incorporated in the eighth aspect of the present invention: the radical oxidization is conducted by controlling the chamber temperature to be 900 degrees Celsius or more (and 1000 degrees Celsius or less) and controlling a chamber pressure to be 10 mTorr.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 1 is a plan view of a semiconductor device in accordance with the present invention.

FIGS. 2A to 2F are comprised of diagrams shown on the left side and the right side thereof, respectively. The diagram shown in the left side of each of FIGS. 2A to 2F is a cross-section diagram showing a manufacturing process of a semiconductor device along line A-A shown in FIG. 1 in accordance with the present invention. On the other hand, the diagram shown on the right side of each of FIGS. 2A to 2F is a cross-section diagram showing a manufacturing process of a semiconductor device along line B-B shown in FIG. 1 in accordance with the present invention.

FIGS. 3A to 3F are comprised of diagrams shown on the left side and the right side thereof, respectively. The diagram shown in the left side of each of FIGS. 3A to 3F is a cross-section diagram showing a manufacturing process of a semiconductor device along line C-C shown in FIG. 1 in accordance with the present invention. On the other hand, the diagram shown in the right side of each of FIGS. 3A to 3F is a cross-section diagram showing a manufacturing process of a semiconductor device along line D-D shown in FIG. 1 in accordance with the present invention.

FIG. 4 is a cross-section diagram of a semiconductor device along line E-E shown in FIG. 1 in accordance with the present invention.

DETAILED DESCRIPTION OF THE PREFERRED EMBODIMENTS

Figure 5A:
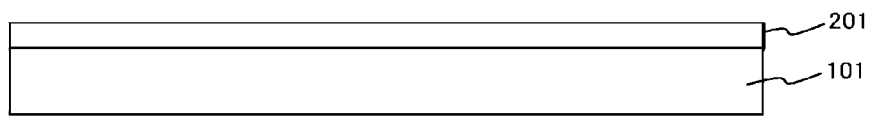
FIGS. 5A to 5H are cross-section diagrams showing a manufacturing process of an element isolation insulating film with a STI method.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

FIG. 1 is a plan view of a semiconductor device 100 in accordance with the present embodiment. A diagram shown on the left side of FIG. 2F is a cross-section diagram of the semiconductor device 100 along a line A-A shown in FIG. 1. A diagram shown on the right side of FIG. 2F is a cross-section diagram of the semiconductor device 100 along a line B-B shown in FIG. 1. A diagram shown on the left side of FIG. 3F is a cross section diagram of the semiconductor device 100 along a line C-C shown in FIG. 1. A diagram shown on the right side of FIG. 3F is a cross-section diagram of the semiconductor device 100 along a line D-D shown in FIG. 1. FIG. 4 is a cross-section diagram of the semiconductor device 100 along a line E-E shown in FIG. 1.

The semiconductor device 100 is a metal-oxide-nitride-oxide-semiconductor (MONOS) type nonvolatile semiconductor memory device. The semiconductor device 100 includes a semiconductor layer 101, an element isolation insulating film 102, and a memory transistor MT formed on the semiconductor layer 101. The region on the semiconductor layer 101, excluding the element isolation insulating film 102, is an active region that functions as a memory element, and the element isolation insulating film 102 is a field region that does not function as a memory element.

The memory transistor MT includes a thermal oxide film 103, a gate electrode (a conductive film) 104, a silicon dioxide film 105, a silicon nitride film 106b, and a silicon dioxide film 107.

The semiconductor layer 101 is a silicon layer, such as a bulk silicon substrate, a SOI substrate, and a SOS substrate. As shown in FIG. 1, the element isolation insulating film 102 is formed in a plurality of regions of the semiconductor layer 101. Also, the planar shape of the element isolation insulating film 102 is nearly rectangular. For example, the element isolation insulating film 102 is comprised of a shallow trench isolation silicon dioxide film (STI silicon dioxide film) that is formed with a STI method. As shown in the diagram shown in the right side of FIG. 2F, the element isolation insulating film 102 is formed to be thicker than the semiconductor layer 101 by a prescribed thickness (e.g., 10 nm). Also, a step portion 102a is comprised of (i) a lower surface 102d, which is the boundary between the upper surface of the semiconductor layer 101 and the lower surface of the thermal oxide film 103, (ii) a sidewall portion 102b, which is a portion of the sidewall of the element isolation insulating film 102 and corresponds to a portion of the sidewall located above the upper side of the semiconductor layer 101, and (iii) an upper surface 102c, which is the upper surface of the element isolation insulating film 102. It is desirable to set the height of the step portion 102a (i.e., the thickness of the step portion 102a) to 10 nm or more. This is because the silicon nitride film 106, which will be described below, is formed so that the thickness of a portion of the silicon nitride film 106 formed on the upper surface 102c of the step portion 102a and the thickness of a portion of the silicon nitride film 106 formed on a lower surface 102d of the step portion 102a can be thicker than that of a portion of the silicon nitride film 106 formed on the sidewall portion 102b of the step portion 102a, as shown on the right side diagram of FIG. 2D.

As shown on the right side diagram of FIG. 2F, the thermal oxide film 103 is formed on the semiconductor layer 101 (i.e., an active region) along the gate electrode 104. The thermal oxide film 103 is comprised of a silicon dioxide film that is formed by thermal oxidization of the semiconductor layer 101. As shown on the left side diagram of FIG. 2F, the thermal oxide film 103 is formed more widely than the gate electrode 104, so that it extends from both lateral sides of the gate electrode 104. The thermal oxide film 103 is formed in a line shape along the gate electrode 104 on the active region.

The gate electrode 104 is a conductive film and functions as a control electrode of the memory transistor MT. As shown in FIG. 1, a plurality of the gate electrodes 104 are formed alongside as word lines. Each of the gate electrodes 104 is formed in a line shape to be located astride the active region functioning as a memory element and an element isolation region isolating memory elements. In other words, the gate electrode 104 is formed on the thermal oxide film 103 as well as on the element isolation insulating film 102. The gate electrode 104 is formed along the step portion 102a. The gate electrode 104 is comprised of a poly-silicon layer 104a and a tungsten silicon (WS) layer 104b that is formed on the poly-silicon layer 104a. For example, the thickness of the gate electrode 104, which is comprised of the thicknesses of the poly-silicon layer 104a and the WS layer 104b, is set to 200 nm.

As shown in the left side diagram of FIG. 2F, a silicon dioxide film 105 is formed on both sides of the gate electrode 104 so that its cross-sectional shape is nearly a L-shape. More specifically, the silicon dioxide film 105 is continuously formed along the sidewalls of the gate electrode 104 and the upper surface of the thermal oxide film 103. As shown in the left side and the right side diagrams of FIG. 3F, the silicon dioxide film 105 is formed along the step portion 102a.

A silicon nitride film 106b is formed on the crosswise portions of the silicon dioxide film 105 whose cross-section shape is nearly L-shaped, and extends in the crosswise direction along these crosswise portions of the silicon dioxide film 105. As shown in the left side and the right side diagrams of FIG. 3F, the silicon nitride film 106b is separated into a portion formed above the active region and a portion formed above the field region by the silicon dioxide film 107. The silicon nitride film 106b in the active region is completely covered with the silicon dioxide films 105, 107, and 109.

As shown on the left side diagram of FIG. 2F, the silicon dioxide film 107 is formed on both sides of the gate electrode 104 so that its cross-section shape is a nearly L-shaped. Also, as shown in the left side and the right side diagrams of FIG. 3F, the silicon dioxide film 107 is formed along the silicon dioxide film 105, in other words, along the gate electrode 104. The silicon dioxide film 107 comes in contact with the silicon dioxide film 105 on a lateral side of the gate electrode 104. In other words, the silicon nitride film 106b is not formed on the sidewalls of the gate electrode 104. Also, the silicon dioxide film 107 comes in contact with the silicon dioxide film 105 along the sidewall portion 102b of the step portion 102a, and thus the silicon nitride film 106b is separated into a portion of the active region and a portion of the field region. As described below, the silicon dioxide film 107 is formed by oxidizing a portion of a silicon nitride film. As shown in the left side and the right side diagrams of FIG. 3F, the silicon dioxide film 107 is formed along the step portion 102a.

As shown in the left side diagram of FIG. 2F, a silicon dioxide film 108 is formed on a crosswise portion and a lengthwise portion of the silicon dioxide film 107 whose cross-section shape is nearly L-shaped. In other words, the silicon dioxide film 108 is formed to fill a space formed by the crosswise portion and the lengthwise portion of the silicon dioxide film 107. As shown in the right side diagram of FIG. 3F, the silicon dioxide film 108 is formed along the silicon dioxide film 105, that is, along the gate electrode 104. Also, the silicon dioxide film 108 is formed along the step portion 102a.

Here, the silicon dioxide film 105, the silicon nitride film 106b, and the silicon dioxide film 107 compose an oxide-nitride-oxide (ONO) film functioning as a charge storage film. In this semiconductor device 100, information is stored by the electrical charges accumulating in electron traps that exist in the silicon nitride film 106b in the active region and in the boundary surface of the silicon nitride film 106b with the silicon dioxide film 105. Also, the silicon dioxide film 105, the silicon nitride film 106b, the silicon dioxide film 107, and the silicon dioxide film 108 comprise the sidewall portion of the memory transistor MT.

As shown in FIG. 4, source-drain regions 110 are formed on the surface of the semiconductor layer 101 on both sides of the gate electrode 104. More specifically, the source-drain regions 110 are formed on the surface of the semiconductor layer 101 outside the thermal oxide film 103, the silicon dioxide film 105, the silicon nitride film 106b, the silicon dioxide film 107, and the silicon dioxide film 108.

The silicon dioxide film 109 is formed all over the active region and the field region to cover the gate electrode 104 and the sidewall portions of the memory transistor MT. More specifically, the silicon dioxide film 109 is formed on the semiconductor layer 101 and the element isolation insulating film 102, and covers the gate electrode 104, the sidewall portions, and the thermal oxide film 103.

Also, as shown in FIG. 4, a silicon dioxide film 111, which functions as an interlayer insulating film, is formed on the silicon dioxide film 109. Openings are formed through the silicon dioxide film 111 and the silicon dioxide film 109 so that they expose the source-drain regions 110 formed on both sides of the gate electrode 104. Also, contacts 112, which are comprised of tungsten (W), are formed in the openings. Furthermore, a wiring 113, which is connected to the contacts 112, is formed on the silicon dioxide film 111. For example, the wiring layer 113 is comprised of aluminium and aluminium alloy.

A method of manufacturing a semiconductor device 110 is hereinafter explained with reference to FIGS. 2A to 2F, 3A to 3F, and 4.

First, a semiconductor substrate, such as a bulk silicon substrate, a SOI substrate, and a SOS substrate, is prepared.

As shown in the left side and the right side diagrams of FIGS. 2A and 3A, an element isolation insulating film 102 is formed in a semiconductor layer 101 of a semiconductor substrate with a STI method. The semiconductor layer 101 is divided into an active region and a field region through this step. The active region is a region in which the element isolation insulating film 102 is not formed and the surface of the semiconductor layer 101 is exposed. Also, the active region functions as a memory. The field region is a region in which the element isolation insulating film 102 is formed. Also, the field region does not function as a memory.

Figure 5B:
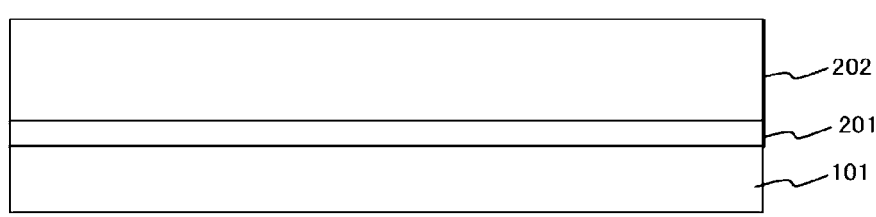
Figure 5C:
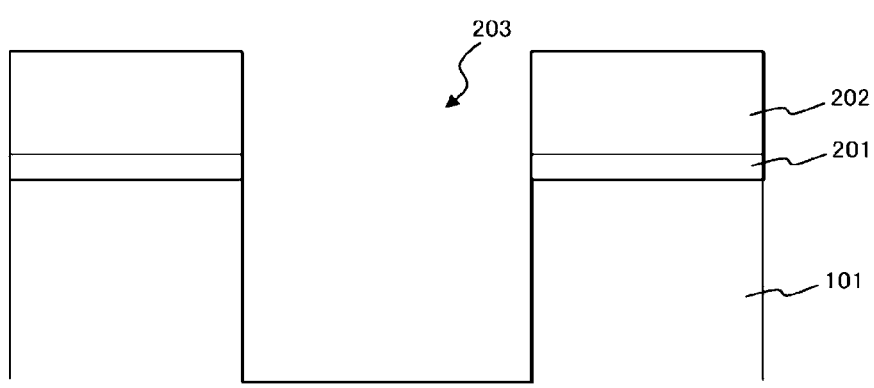
Figure 5D:
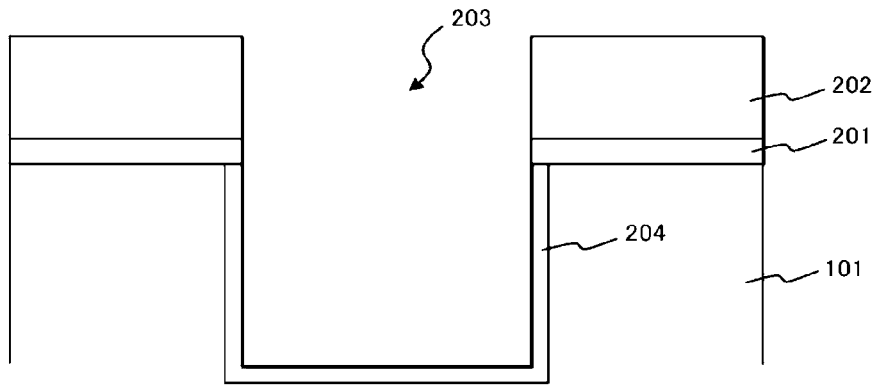
Figure 5E:
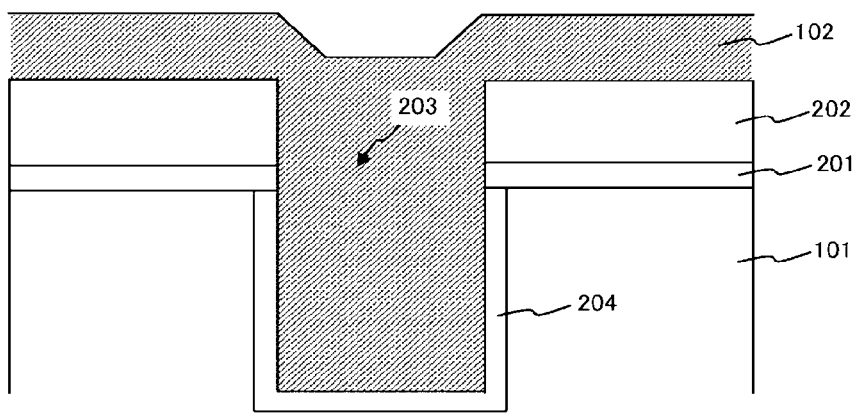

Here, a manufacturing process of the element isolation insulating film 102 is explained in reference to FIGS. 5A to 5H. First, as shown in FIG. 5A, a pad oxide film 201 is formed by conducting thermal oxidization with respect to the upper surface of the semiconductor layer 101. Next, as shown in FIG. 5B, a silicon nitride film 202 is deposited on the pad oxide film 201 with a CVD method. The thickness of the silicon dioxide film 202 formed on the pad silicon dioxide film 201 is set so that the silicon dioxide film 202 of nearly 100 nm in thickness remains after it is polished with a CMP method. In other words, the thickness of the silicon dioxide film 202 is derived by adding the thickness to be polished to 100 nm. Next, a resist pattern exposing a region in which an element isolation insulating film 102 will be formed in a later step is formed on the silicon nitride film 202. Then, as shown in FIG. 5C, a trench 203 is formed by etching the silicon dioxide film 202, the pad silicon dioxide film 201, and the semiconductor layer 101 with this resist pattern. Next, as shown in FIG. 5D, a thermal oxide film 204 is formed by conducting thermal oxidization with respect to an interior wall of the trench 203. This thermal oxide film 204 functions as a buffer film with respect to a CVD oxide film that will be implanted into the trench 203 in a later step. Then, as shown in FIG. 5E, a silicon dioxide film 102 is deposited into the trench 203 and on the silicon nitride 202 with a CVD method. The silicon dioxide film 102 functions as an element isolation insulating film and its thickness is set to a prescribed value.

Figure 5F:
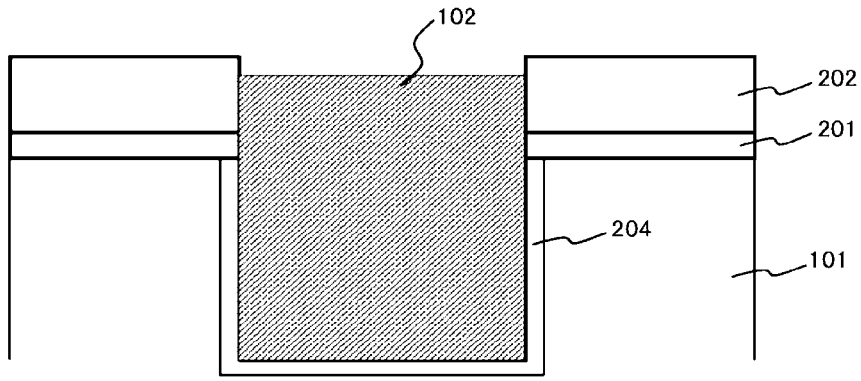

Next, as shown in FIG. 5F, the silicon dioxide film 102 is polished and eliminated with a CMP method by using the silicon nitride film 202 as a stopper. The thickness of the silicon nitride film 202 is polished with a CMP method so that the silicon nitride film 202 of nearly 100 nm in thickness remains after the CMP method is conducted. Also, the thickness of the step portion 102a (i.e., the height of the sidewall portion 102b) is influenced by the thickness of the silicon nitride film 202.

Figure 5G:
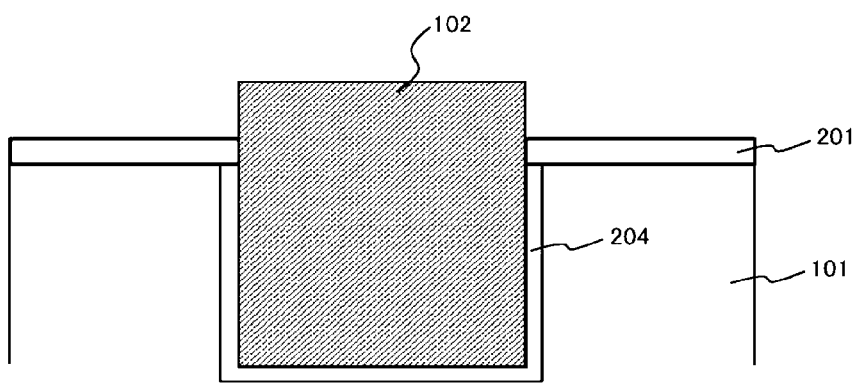
Figure 5H:
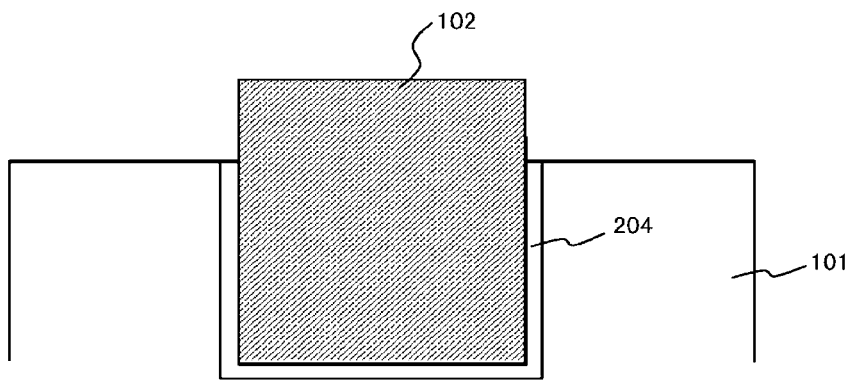

Next, as shown in FIG. 5G, the silicon nitride film 202 is eliminated after the thickness of the silicon dioxide film 102 remaining in the trench 203 is adjusted with a hydrofluoric acid treatment. Finally, as shown in FIG. 5H, the pad oxide film 201 is eliminated. The thickness of the silicon dioxide film 102 is decreased by nearly 20-30 nm in this elimination step of the pad oxide film 201. Through these steps, the element isolation insulating film (i.e., a silicon dioxide film) 102 is formed to be thicker than the semiconductor layer 101 by a prescribed thickness.

In the present embodiment, the prescribed thickness is set to 10 nm or more. The thickness of the element isolation insulating film 102 is adjusted by factors including the thickness of the silicon nitride film 202 formed on the pad oxide film 201, the thickness of the silicon dioxide film 102 to be polished with a CMP method, and the level of hydrofluoric acid treatment. All of the above described three adjustment factors may be used in combination. Also, two of the three adjustment factors may be selected and used in combination. In addition, only one of the three adjustment factors may be selected and used. In the present embodiment, the thickness of the silicon nitride film 202 is set to 100 nm. After the silicon dioxide film 102 is polished, the thickness of a portion of the silicon dioxide film 102 above the surface of the semiconductor layer 101 is adjusted to nearly 30 nm or more (and 40 nm or less). In the elimination step of the pad oxide film 201, the thickness of a portion of the silicon dioxide film 102 above the surface of the semiconductor layer 101 is adjusted to 10 nm or more.

The steps of manufacturing the semiconductor device 100 after the element isolation insulating film 102 is formed are hereinafter explained. As shown in the left side and the right side diagrams of FIGS. 2B and 3B, a thermal oxide film 103 is formed in the active region of the semiconductor layer 101, and a gate electrode 104 is formed on the thermal oxide film 103. More specifically, the thermal oxide film 103 is formed by conducting thermal oxidization with respect to the surface of the semiconductor layer 101. Then, a poly-silicon layer of nearly 100 nm in thickness and a tungsten silicon (WS) layer of nearly 100 nm in thickness are sequentially laminated on the thermal oxide film 103. Next, a gate electrode (i.e., a word line) 104, which is comprised of a poly-silicon layer 104a and a WS layer 104b, is formed in a shape shown in FIG. 1 by conducting patterning with respect to the poly-silicon layer and the WS layer. Here, the thickness of the gate electrode 104 is set to 200 nm. In other words, this corresponds to a combined thickness of the poly-silicon layer 104a (100 nm) and the WS layer 104b (100 nm). As shown in the right side diagram of FIG. 2B, the gate electrode 104 is formed along the upper surface of the thermal oxide film 103, the sidewall portion 102b, and the upper surface 102c. That is, it is formed along the step portion 102a.

Next, as shown in the left side and the right side diagrams of FIGS. 2C and 3C, a silicon dioxide film 105 of 5 nm or more (and 10 nm or less) in thickness is deposited above the whole semiconductor substrate to cover the gate electrode 104, the thermal oxide 103, and the element isolation insulating film 102 with a CVD method. As shown in the right side diagram of the FIG. 2C and the left side and the right side diagrams of FIG. 3C, the silicon dioxide film 105 is formed along the step portion 102a.

Next, as shown in the left side and the right side diagrams of FIGS. 2D and 3D, a silicon nitride film 106 is formed on the silicon dioxide film 105 with a low pressure CVD (LPCVD) method. The silicon nitride film 106 is formed along the silicon dioxide film 105, that is, along the step portion 102a. In this LPCVD method, dichlorosilane ($SiH_2Cl_2$) and ammonia ($NH_3$) are used as reaction gases, and the chamber pressure is controlled to less than 0.25 Torr. Also, the flow direction of the reaction gas is controlled so as to be in a nearly vertical direction from above the semiconductor substrate towards its upper surface. The reaction gas easily brings about chemical reactions above the semiconductor substrate, and SiN is easily produced through the chemical reactions, because the chamber pressure is controlled to less than 0.25 Torr. The thickness of the portion of the silicon nitride film 106 formed along the sidewall portion 102b of the step portion 102a and formed on the sidewalls of the gate electrode 104 can be formed more thinly than that of the other portions of the silicon nitride film 106, because the generated SiN flows from above the semiconductor substrate to its upper surface. In the present embodiment, if the thickness of a portion of the silicon nitride film 106 formed in the lengthwise direction (i.e., the vertical direction with respect to the surface of the semiconductor substrate) is defined as 100% of the thickness, the thicknesses of the portion of the silicon nitride film 106 formed along the sidewall portion 102b of the step portion 102a and formed on the sidewalls of the gate electrode 104 can be defined as nearly 50% of the thickness. More specifically, as shown in the left side and the right side diagrams of FIGS. 2D and 3D, the silicon nitride film 106 is formed so that the thickness thereof formed along the sidewall portion 102b of the step portion 102a and formed on the sidewall portions of the gate electrode 104 is set to 10 nm, and the thickness of the other portions is set to 20 nm.

As described above, a method for forming a silicon nitride film 106 with a LPCVD method is explained. However, the silicon nitride film 106 may be formed with a plasma CVD method. In the plasma CVD method, $SiH_2Cl_2$ and $NH_4$ are used as reaction gases, and the flow direction of the reaction gas is controlled so as to be in a nearly vertical direction from above the semiconductor device towards its upper surface. Also, the RF power is set to approximately several hundreds watts (W)

Next, as shown in the left and the right FIGS. 2E and 3E, radical oxidization is conducted with respect to the silicon nitride film 106. As a result, only its thickness of 10 nm is radical-oxidized. In other words, the radical-oxidized thickness of the silicon nitride film 106 corresponds to the thicknesses of the portions of the silicon nitride film 106 formed along the sidewall portion 102b of the step portion 102a and formed on the sidewalls of the gate electrode 104. These portions of the silicon nitride film 106 are hereinafter called thin film portions. Also, in radical oxidization, $H_2$ gas and $O_2$ gas are injected into the chamber at a gas flow rate of 6 liter/minute and 12 liter/minute, respectively. The chamber temperature is controlled to 900 degrees Celsius or more (and 1000 degrees Celsius or less) with a ramp heating, and a chamber pressure is controlled to 10 Torr or less. In such radical oxidization at a low temperature and a low pressure, the silicon nitride film 106 is oxidized at a rate of 10 nm/3-4 minutes.

As shown in the left side diagram of FIG. 2E, when the silicon nitride film 106 is oxidized with radical oxidization by the thickness corresponding to the thickness of the thin film portion of the silicon nitride film 106, the thin film portions of the silicon nitride film 106 formed on the sidewalls of the gate electrode 104 are all oxidized. Thus a silicon dioxide film 107, which is formed through this oxidization step, comes in contact with the silicon dioxide film 105. As a result, as shown in the left side and the right side diagrams of FIG. 2E, the silicon nitride film 106 is separated into a portion that is formed above the gate electrode 104 (i.e., a silicon nitride film 106a) and a portion that is formed on the silicon dioxide film 105 and located on both sides of the gate electrode 104 (i.e., a silicon nitride film 106*b*) by the silicon dioxide film 107.

As shown in the right side diagram of FIG. 2E, when the silicon nitride film 106*a* is viewed along the direction in which the gate electrode 104 is formed, the portions of the nitride film 106 formed along the sidewall portion 102*b* of the step portion 102*a* (i.e., the thin film portions), are all oxidized and changed into portions of the silicon dioxide film 107. In other words, the portion of the silicon dioxide film 107 formed along the sidewall portion 102*b* of the step portion 102*a* comes in contact with the portion of the silicon dioxide film 105 formed under the silicon nitride film 106 and along the sidewall portion 102*b* of the step portion 102*a*. As a result, the silicon nitride film 106*a* is separated into a portion formed on the active region and a portion formed on the field region.

Also, as shown in the left side diagram of FIG. 3E, when the silicon nitride film 106 formed along the sidewalls of the gate electrode 104 is viewed along the direction in which the gate electrode 104 is formed, the silicon nitride film 106*b* is formed on the silicon dioxide film 105. The following is the reason that the thickness of the oxidized portion of the silicon nitride film 106 is thick along line C-C as shown in the left side diagram of FIG. 3E. As shown in the left side diagram of FIG. 2D, even though the lengthwise thickness of the silicon nitride film 106 is thick, the crosswise thickness of the silicon nitride film 106 corresponds to the thickness of the thin film portion formed on the sidewalls of the gate electrode 104. Therefore, the whole thickness is oxidized in the crosswise direction. Also, the portions of the silicon dioxide film 107 that is formed along the sidewall portion 102*b* of the step portion 102*a* comes in contact with the portions of the silicon dioxide film 105 that are formed under the silicon nitride film 106 and formed along the sidewall portion 102*b* of the step portion 102*a*. Also, as shown in the right side diagram of FIG. 3E, the thin film portions of the silicon nitride film 106, which are formed along the sidewall portion 102*b* of the step portion 102*a*, are all oxidized. As a result, the portions of the silicon dioxide film 107, which are formed along the sidewall portion 102*b* of the step portion 102*a*, come in contact with the portions of the silicon dioxide film 105, which are formed under the silicon nitride film 106 and formed along the sidewall portions 102*b* of the step portion 102*a*. Therefore, when the silicon nitride film 106*b* formed on both sides of the gate electrode 104 is viewed along the direction in which the gate electrode 104 is formed, it is separated into a portion formed on the active region and a portion formed on the field region. In other words, the portion of the silicon nitride film 106*b* formed on the active region functioning as a memory element is separated from the portion of the silicon nitride film 106*b* formed on the field region by the silicon dioxide film 107.

Next, as shown in the left side and the right side diagrams of FIGS. 2F and 3F, a silicon dioxide film 108 is deposited on the whole upper surface of the silicon dioxide film 107 with a CVD method. Then, an etch-back treatment is conducted until the surface of the semiconductor layer 101 is exposed on both sides of the gate electrode 104. Thus, sidewall portions of the gate electrode 104 are formed. In other words, the upper surfaces of the gate electrode 104 and the semiconductor layer 101 are exposed by conducting a etch-back treatment for the silicon dioxide film 108, the silicon dioxide film 107, the silicon nitride films 106*a* and 106*b*, the silicon dioxide film 105, and the thermal oxide film 103 without using any etching-mask. As a result, as shown in the left side diagram of FIG. 2F, the sidewall portions comprised of the silicon dioxide film 105, the silicon nitride film 106*b*, the silicon dioxide film 107, and the silicon dioxide film 108 are formed on both sides of the gate electrode 104. The shapes of the silicon dioxide film 105 and the silicon dioxide film 107 in the sidewall portions are both nearly L-shaped in the cross-section view. Also, the silicon nitride film 106*b* is formed between the crosswise-extended portion of the silicon dioxide film 105 and that of the silicon dioxide film 107.

Next, impurities are implanted into both sides of the gate electrode 104, that is, the surface of the semiconductor layer 101 formed on both sides of the sidewall portions, by using the gate electrode 104 and the sidewall portions as masks. Thus, source-drain regions (impurity diffusion regions) 110 are formed as shown in FIG. 4. Then, a silicon dioxide film 109 of 10 nm in thickness is deposited on the whole surface of the semiconductor substrate with a CVD method. As a result, the gate electrode 104, the sidewall portions, the thermal dioxide film 103, the semiconductor layer 101, and the element isolation insulating film 102 are covered with the silicon dioxide film 109.

Next, as shown in FIG. 4, a silicon dioxide film 111 is formed as an interlayer insulating film with a CVD method. Also, openings, which expose each of the source-drain regions 110, are formed in the silicon dioxide films 109 and 111. Then, contacts 112 are formed by implanting tungsten (W) into each of the openings. Thus, a wiring layer 113, which is connected to the contacts 112, is formed on the silicon dioxide film 111.

Through the above described manufacturing process, a semiconductor device 100 shown in FIG. 6 is formed.

In a nonvolatile semiconductor memory in which electrical charges accumulate in a silicon nitride film, a silicon nitride film, which is formed on an active region and simultaneously formed in a lower portion of sidewall portions of a gate electrode, functions as a storage portion that stores information. In other words, the threshold voltage Vt of a memory transistor and the amount of the reading current (i.e., the cell current) are regulated by the silicon nitride film formed on the active region and in the lower portion of the sidewalls of the gate electrode.

In the semiconductor device 100 in accordance with the present embodiment, the silicon nitride film 106*b* is formed between the crosswise-extended portions of the silicon dioxide films 105 and 107, and simultaneously formed only in the lower portion of the sidewall portion of the gate electrode 104. In other words, the silicon nitride film 106*b* does not have a portion formed along the sidewall of the gate electrode 104 (i.e., the lengthwise portion), but it only has the lower portion of the sidewall portion of the gate electrode 104 (i.e., the crosswise portion). Because of this structure, it is possible to prevent electrical charges, which accumulate in the charge traps existing in the silicon nitride film 106*b* formed on the active region and in the boundary of the silicon nitride film 106*b* with the silicon dioxide film 105 formed in the lower portion of the sidewall portion of the gate electrode 104, from moving to the lengthwise portion that does not function as a memory through the inter-charge traps transfer of the electrical charges. As a result, it is possible to prevent the threshold voltage Vt of the memory transistor MT from changing over time. In other words, it is possible to prevent the reading current (i.e., the cell current) form changing over time by the change of the threshold voltage Vt of the memory transistor MT over time.

Also, the silicon nitride film 106*b* is separated into the potion formed on the active region and the portion formed on the field region through the portion of the silicon dioxide film 107 formed along the sidewall portion 102*b* of the step portion 102*a*. Therefore, it is possible to prevent electrical charges, which accumulate in the charge traps in the portion of the silicon nitride film 106*b* formed on the active region, from moving to the portion of the silicon nitride film 106b formed on the field region through the inter-charge traps transfer of the electrical charges. As a result, it is possible to prevent electrical charges accumulating in the portion of the silicon nitride film 106b formed on the active region from moving to the portion of the silicon nitride film 106b formed on the field region. Therefore, it is possible to prevent the cell current from changing over time.

Also, according to the method for manufacturing a semiconductor device in accordance with the present embodiment, the thickness of the element isolation insulating film 102 is formed more thickly than that of the semiconductor layer 101 by the thickness of the step portion 102a (i.e., height of the sidewall portion 102b). Also, the flow direction of the reaction gas is controlled so as to be in a nearly vertical direction, that is, the direction from above the semiconductor substrate towards the upper surface of the semiconductor substrate, and the chamber pressure is controlled to be a low pressure in a LPCVD method. Therefore, the thickness of the portion of the silicon nitride film 106 formed on the gate electrode 104 and that of the portion of the silicon nitride film 106 formed along the sidewall portion 102b of the step portion 102a are formed more thinly than thicknesses of the other portions of the silicon nitride film 106. Also, the thin film portions of the silicon nitride film 106 formed on the sidewall portion of the gate electrode and formed along the sidewall portion 102b of the step portion 102a are completely oxidized. As a result, the lengthwise portion of the silicon nitride film 106 formed on the sidewall portion of the gate electrode 104 is completely oxidized. Thus, the silicon nitride film 106b can be formed only in the lower portion of the sidewall portions of the gate electrode 104. Furthermore, the portion of the silicon nitride film 106 formed along the sidewall portion 102b of the step portion 102a is completely oxidized. Thus, the silicon nitride film 106 can be completely separated into the portion formed on the active region and the portion formed on the field region. In other words, the silicon nitride film 106b can be formed only in the lower portion of the sidewall portions of the gate electrode 104 by oxidizing the silicon nitride film 106 in a self-alignment fashion, and the silicon nitride film 106b can be formed to be separated from the portion formed on the field region. Therefore, a mask is not needed for oxidization of the silicon nitride film 106. Because of this, the manufacturing process of the semiconductor device can be simplified and increases in the manufacturing costs of the semiconductor device can be prevented.

In the present embodiment, the silicon nitride film 106 is formed on both the active region and the field region, and then it is separated into the portion formed on the active region and the portion formed on the field region. However, after the silicon nitride film 106 is formed on both the active region and the field region, the portion of the silicon nitride film 106 formed on the field region may be eliminated by using the portion of the silicon nitride film 106 med on the active region a mask. In this case, the silicon nitride film 106 is formed only on the active region functioning as a memory. Because of this structure, it is possible to prevent electrical charges accumulating in the silicon nitride film 106 from moving to regions other than the active region. Therefore, it is possible to prevent the cell current from changing over time.

This application claims priority to Japanese Patent Application No. 2005-43200. The entire disclosure of Japanese Patent Application No. 2005-43200 hereby incorporated herein by reference.

The terms of degree, such as "nearly" and "substantially," used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device, comprising:
   a semiconductor layer;
   a first insulating film formed in said semiconductor layer;
   an elongated conductive member continuously formed above said semiconductor layer and said first insulating film, said conductive member having a bottom side that is oriented toward said semiconductor layer, a top side that is oriented away from said semiconductor layer, and first and second sidewalls that extend between said top and bottom sides;
   a second insulating film formed between said conductive member and said semiconductor layer along said conductive member;
   a first sidewall portion formed on said first sidewall of said conductive member and along said conductive member, said first sidewall portion including an oxide film and a first nitride film that is formed above said semiconductor layer and being separated from a region above said first insulating film; and
   impurity diffusion regions formed in said semiconductor layer adjacent said first and second sidewall portions,
   wherein said oxide film is a first oxide film that is disposed under said first nitride film,
   wherein said first sidewall portion further comprises a second oxide film formed on said first nitride film,
   wherein said first oxide film and said second oxide film come in contact with each other at a boundary between said semiconductor layer and said first insulating layer,
   wherein said first insulating film is thicker than said semiconductor layer, and
   wherein said conductive member and said first and second oxide films are formed along a step portion at an edge of said first insulating film.

2. The semiconductor device according to claim 1,
   wherein said first oxide film and said second oxide film extend continuously along said first sidewall portion of said conductive member, and simultaneously come in contact with each other along said first sidewall portion of said conductive member.

3. The semiconductor device according to claim 2,
   wherein said first oxide film and said second oxide film are formed to be nearly L-shaped in a cross-section view; and
   wherein said first nitride film is formed between crosswise-extended portions of said first oxide film and said second oxide film.

4. The semiconductor device according to claim 1,
   wherein said first sidewall portion further comprises a second nitride film formed above said first insulating film.

5. The semiconductor device according to claim 1, further comprising a second sidewall portion formed on said second sidewall of said conductive member, wherein said second sidewall portion comprises another oxide film and another first nitride film.

6. The semiconductor device according to claim 1, wherein said conductive member is a word line of a nonvolatile memory, and wherein, in a channel region adjacent said impurity diffusion regions, said oxide film and said first nitride film are disposed below said top side of said conductive member.

* * * * *